United States Patent
Langer et al.

(10) Patent No.: US 7,688,136 B2
(45) Date of Patent: Mar. 30, 2010

(54) SHARED LINEARITY MAINTENANCE IN POWER AMPLIFIERS

(75) Inventors: Andreas Langer, Unterschleissheim (DE); Andrea Camuffo, München (DE)

(73) Assignee: Infineon Technologies AG, Nuebiberg (DE)

( * ) Notice: Subject to any disclaimer, the term of this patent is extended or adjusted under 35 U.S.C. 154(b) by 0 days.

(21) Appl. No.: 12/358,256

(22) Filed: Jan. 23, 2009

(65) Prior Publication Data

US 2009/0128233 A1   May 21, 2009

Related U.S. Application Data

(63) Continuation of application No. 11/876,484, filed on Oct. 22, 2007, now Pat. No. 7,557,653.

(60) Provisional application No. 60/863,109, filed on Oct. 26, 2006.

(51) Int. Cl.
   *H03G 3/20* (2006.01)
(52) U.S. Cl. .................. 330/129; 330/279; 330/102; 330/291
(58) Field of Classification Search .............. 330/129, 330/279, 102, 291
   See application file for complete search history.

(56) References Cited

U.S. PATENT DOCUMENTS

| 3,428,909 | A | * | 2/1969 | Rubin et al. ............... 330/276 |
| 6,081,161 | A | * | 6/2000 | Dacus et al. ............... 330/297 |
| 6,580,318 | B2 | * | 6/2003 | Taylor ...................... 330/129 |
| 6,917,245 | B2 | * | 7/2005 | Dupuis et al. .............. 330/279 |
| 7,352,244 | B2 | * | 4/2008 | Takahashi et al. .......... 330/279 |
| 7,486,137 | B2 | * | 2/2009 | Magoon et al. ............ 330/140 |
| 2004/0082354 | A1 | | 4/2004 | Cohen |
| 2006/0192616 | A1 | | 8/2006 | Takahashi et al. |

FOREIGN PATENT DOCUMENTS

| WO | 8400258 A1 | 1/1984 |
| WO | 8703378 A1 | 6/1987 |
| WO | 2005086360 A1 | 9/2005 |

* cited by examiner

*Primary Examiner*—Patricia Nguyen
(74) *Attorney, Agent, or Firm*—SpryIP, LLC

(57) ABSTRACT

In some embodiments, a circuit includes a power amplifier including an input terminal configured to receive an input signal and an output terminal to provide an RF voltage, the output terminal coupled to a load, a current sensor configured to sense the current drawn by the power amplifier and provide a first sensor output signal dependent upon current consumption when the current exceeds a predetermined current threshold, a voltage sensor configured to sense the output power of the power amplifier and provide a second sensor output signal when the RF voltage during up ramp falls below a predetermined threshold voltage, and a summing circuit configured to receive the first and second sensor output signals and provide a feedback signal including a combination of a power dependent contribution and either of a voltage dependent contribution or a current dependent contribution.

12 Claims, 2 Drawing Sheets

SHARED LINEARITY MAINTENANCE IN POWER AMPLIFIERS

TECHNICAL FIELD

Embodiments described herein relate generally to power amplifiers and more particularly, to power amplifiers for driving antennas of varying load impedance.

BACKGROUND

Global System for Mobile Communications (GSM) is one of the standards used for mobile phones. Gaussian Minimum Shift Keying (GMSK) is a type of continuous-phase frequency-shift keying used in GSM. Enhanced Data rate for GSM Evolution (EDGE) is a digital mobile technology used in conjunction with GSM to provide packet-switched applications such as internet connection. EDGE additionally uses 8 phase-shift keying (8PSK) as part of the modulation and coding scheme. Mobile handsets using such technologies use power amplifiers and derive power from a battery.

DETAILED DESCRIPTION

Figure 1:
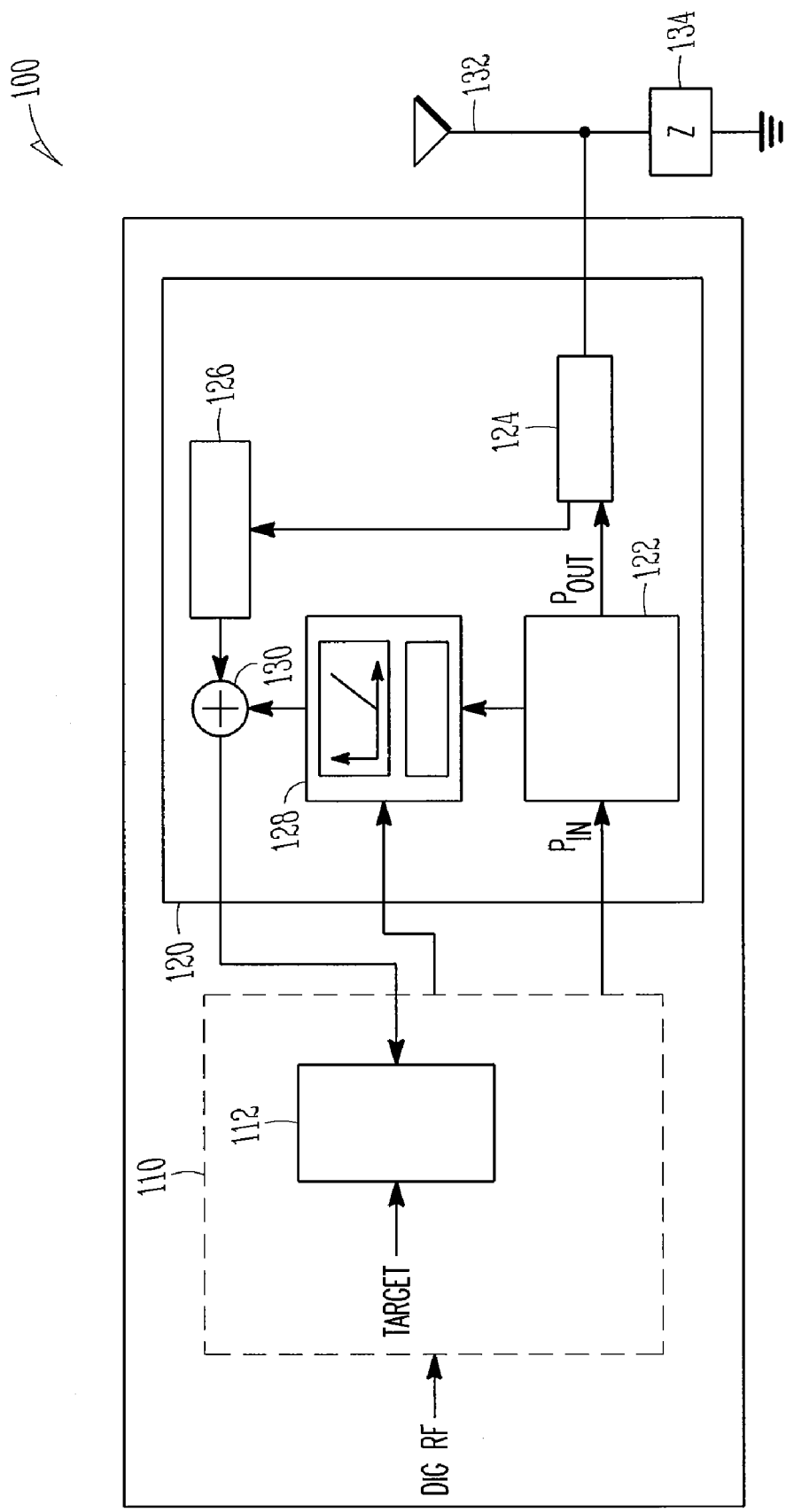
FIG. 1 illustrates a schematic of a circuit for maintaining shared linearity in power amplifiers, according to some embodiment of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Amplifier linearity is a fundamental requirement for the operation of EDGE technology in mobile handsets. Any amplitude distortion of the signal envelope produces two unacceptable phenomena. Firstly, the spectrum of the signal is widened (also known as spectral re-growth). This widening effect can cause the signal to fail the prescribed modulation mask, a requirement set by the GSM standards to prevent interference to neighboring channels. Secondly, a simple distortion of the modulation constellation results in a lowered signal to noise ratio at the receiver. The GSM standards define an error vector magnitude (EVM) specification, which is a measure of the difference between the transmitted signal and an ideal one. In practice, imperfections in the modulator, other transmitter stages and non-linearity in the power amplifier can consume a significant fraction of the EVM budget.

EDGE standard is based on a modified 8PSK modulation scheme. As a result of baseband filtering the final modulation signal is also amplitude modulated which means a non-constant envelope. Consequently, due to the presence of a non-constant envelope, the spectrum at the output of power amplifier strongly depends on the linearity of the power amplifier used. Hence, it is desired to have 8PSK power amplifiers optimized in order to meet the stringent linearity requirements.

There are two classes of 8PSK power amplifiers. The first class supports Envelope Elimination and Restoration (EER) architectures (e.g. Large Signal Polar Loop, Polar Modulator). Here, the RF input signal is phase modulated and the amplitude modulation is injected via the power amplifier supply voltage or the power amplifier bias voltage (to do this the final 8PSK signal after Base Band filtering must be separated in AM and PM using a "polar" approach). Power amplifiers in this first class is non-linear with respect to RF input signal but should have a linear relationship between RF voltage and bias/supply voltage. Additionally, if the power amplifier is not linear at this point a closed loop AM control or AM pre-distortion can be used. The second class of power amplifiers is linear with respect to RF input signal. Additionally, the RF input signal is amplitude modulated and phase modulated.

The linearity performance of a linear power amplifier can strongly depend on the load impedance of the antenna. A non-sufficient linearity performance is indicated by bad EVM and/or bad spectrum due to modulation Adjacent Channel Power Ratio (ACPR). Depending on load, phase difference effects are responsible for degradation of spectrum. For load states that result in a high impedance (typically seen at the last stage of power amplifiers), the RF voltage is clipped thereby resulting in a non-linear behavior. In the low impedance case, the input impedance at the last stage of the power amplifier is affected in such a way that more power is delivered to last stage thereby resulting in current clipping (negative swing effect). This effect could be improved by increasing the quiescent current, but, the improvement is achieved at the expense of efficiency.

Low and high impedance load states are potential sources for significant ACPR degradation. Consequently, understanding of the low and high impedance load states is important and any measure intended to improve linearity must address both effects of low and high impedance load states.

In some embodiments, an 8PSK linear power amplifier is designed to cope with a certain voltage standing wave ratio (VSWR). For severe load (impedance) mismatch the ACPR and EVM performance gets worse. In some embodiments, in order to maintain sufficient ACPR and EVM at severe load mismatch, the forward power is reduced.

In some embodiments, either change of load impedance or mitigation of load VSWR is achieved. The change of load impedance is achieved by load switching. The VSWR mitigation is realized by using hybrid architecture. The hybrid approach is effective to increase load insensitivity but only works up to a particular VSWR. Beyond this particular VSWR, the spectrum is corrupted. Load switching technique in handsets can be complex and expensive to achieve. The alternate approach relies on reduction of output power. One approach used is to take the reflected signal as an indication for mismatch. However, the linearity degradation also depends on the phase of the reflected signal from the load. Since, only the magnitude of reflected signal is measured, the output power is also reduced for different load phases where it is actually not necessary. Consequently, Total Radiated Power (TRP) performance is sacrificed. TRP is the measure of the mobile device's radiated output power. TRP is a function of the output power of the power amplifier, the antenna's radiation efficiency and the power amplifier's sensitivity to antenna mismatch (impedance mismatch). Improvements in TRP can increase network efficiency, network coverage and data throughput rates while also reducing the frequency of dropped calls.

FIG. 1 illustrates a schematic of a circuit 100 for maintaining shared linearity in power amplifiers, according to some embodiment of the invention. Circuit 100 includes a front end circuit 110, and an amplifier circuit 120 coupled to an antenna 132 and impedance 134. Front end circuit 110 includes a controller 112. Amplifier circuit 120 includes a power amplifier 122, coupler 124, power detector (voltage sensor) 126, current/saturation sensor 128, and summing circuit 130. Power amplifier 122 receives input power $P_{IN}$ and amplifies $P_{IN}$ and outputs a power $P_{OUT}$.

In some embodiments, since load state is not known, the mobile SW cannot induce the power reduction. Therefore, it is required that the transceiver module has built-in linearity sensors intended to recognize load states which cause spectral degradation. In some embodiments, two sensors are incorporated into the amplifier circuit 120 namely the current/saturation sensor 128 and power detector (voltage sensor) 126. The current/saturation sensor 128 is needed to recognize the low impedance case (below matched impedance) whereas the power detector (voltage sensor) 126 is relevant for high impedance case (above matched impedance). The current/saturation sensor 128 measures the DC current of power amplifier 122. High current consumption is an indication of the presence of a low impedance load. When the DC current exceeds a threshold the current/saturation sensor 128 is activated and generates a voltage which depends on current consumption. The power detector (voltage sensor) 126 measures the minimum RF voltage during up ramp. When the RF voltage falls below a given threshold voltage $V_{RF,\ min}$ the sensor is activated.

In some embodiments, a Shared Linearity Maintenance scheme is used as part of a power control loop (hereafter called APC) in the power amplifier. In some embodiments, a closed loop power control for 8PSK is used and it includes a coupler 124, a power detector (not shown) and controller 112. In some embodiments, the controller is incorporated in an RF transceiver and the coupler 124 and the power detector are inside the power amplifier 122.

In some embodiments, both sensors generate a voltage which either depends either on current or minimum RF voltage. The current/saturation sensor 128 generates a voltage which is proportional to DC current consumption. The power detector (voltage sensor) 126 generates a voltage which is proportional to a minimum RF voltage. At any given time, only one of the current/saturation sensor 128 or the power detector (voltage sensor) 126 is active. The voltages generated by current/saturation sensor 128 or voltage sensor 126 are termed as sensor voltages.

The principle of Shared Linearity Maintenance relies on analog feedback. In some embodiments, the sensor voltage is added to the power detector voltage. The power detector voltage itself is output power dependent and provided by power detector. In some embodiments, the total $V_{det}$ signal is used by APC and therefore fed back to a transceiver. In some embodiments, the transceiver includes the controller 112. The current/saturation dependent contribution of $V_{det}$ is zero as long as the DC current consumption is smaller than the current threshold lip or the RF voltage is more than min RF voltage $V_{RF,min}$.

In some embodiments, in order to meet the linearity requirement under mismatch conditions, the forward power must be reduced to increase power back-off (which would result in more margins being needed for mismatch). In some embodiments, the power control loop tries to achieve the detector voltage which was phased during production. To reduce the forward power the difference between target detector voltage and detector voltage corresponding to DC current limit or min RF voltage limit (reduced forward power) must be provided by sensor circuit. In some embodiments, as a result of the added voltage, the power control loop presumes that a higher forward power ("loop fooling") is present and the same $V_{det}$ level results in a lower forward power.

In some embodiments, the current and voltage thresholds are programmable. This provides for more flexibility for handset manufacturers. In some embodiments, the thresholds can be optimized depending on a particular antenna characteristic. In some embodiments, the programming can be done via a serial peripheral interface (SPI) available in the amplifier circuit. In some embodiments, availability of soft current/voltage limiting function achieves good transient spectrum performance. In some embodiments, the output power is only reduced if really necessary and thereby resulting in better radiation performance of the handset.

In some embodiments, the invention combines the advantages of power control and current/RF voltage control loop (hybrid loop). This is achieved by providing a loop feedback signal which comprises both a power-dependent contribution and either one of a current dependent contribution or a voltage dependent contribution provided by using the voltage sensor 126 or current sensor 128. In some embodiments, at moderate VSWR, the power control loop allows for greater output power accuracy and at severe load mismatch, the forward power is reduced in order to maintain good linearity.

In some embodiments, a conventional APC design can be re-used by providing additional hardware provided within the power amplifier.

Figure 2:
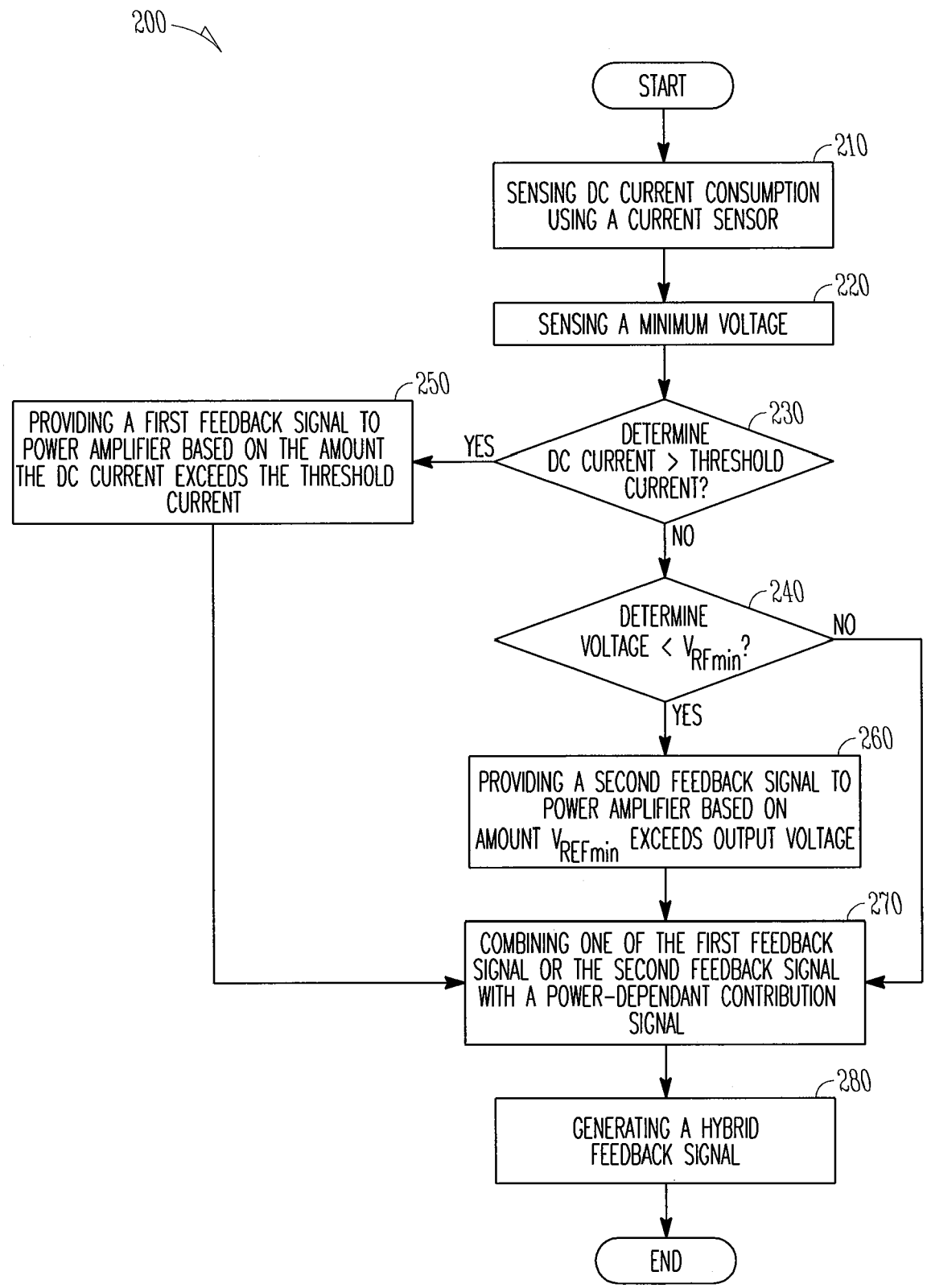
FIG. 2 shows a flow diagram of a method to maintaining shared linearity in power amplifiers, according to some embodiment of the invention.

Some embodiments of a method 200 for improving the operation of an amplifier are shown in FIG. 2. In a first of a series of actions 210, the circuit is sensing a dc current drawn by an amplifier coupled to receive an input signal and deliver an output voltage to a load. At block 220, method 200 includes a further action of sensing the minimum output voltage. At block 230, method 200 includes the action of comparing the dc current drawn by the amplifier to a predetermined threshold current. At block 240, method 200 includes the action of comparing the minimum output voltage to a predetermined minimum output voltage. At block 250, method 200 includes the action of providing a first feedback signal if the dc current exceeds the current threshold, the amplitude of the first feedback signal determined by the amount that the DC current exceeds the threshold current.

At block 260, the action is providing a second feedback signal if the dc current is less than the current threshold and if the output voltage is less than a predetermined minimum output voltage, the magnitude of the second feedback signal determined by the amount that the predetermined minimum output voltage exceeds the minimum output voltage.

At block 270, the action is combining one of the first feedback signal or the second feedback signal with a power-dependent contribution signal received from an output power sensor.

At block 280, the action is generating a hybrid feedback signal based on the power-dependent contribution and either one of the first feedback signal and the second feedback signal.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments.

Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A circuit; comprising:
    a power amplifier including
        a current sensor configured to sense the current drawn by the power amplifier and provide a first sensor output signal dependent upon current consumption when the current exceeds a predetermined current threshold;
        a voltage sensor configured to sense an output power of the power amplifier and provide a second sensor output signal when the RF voltage during up ramp falls below a predetermined threshold voltage; and
        a summing circuit configured to receive the first and second sensor output signals and provide a feedback signal including a combination of a power dependent contribution and either of a voltage dependent contribution or a current dependent contribution.

2. The circuit of claim 1, wherein an automatic power controller is coupled to the power amplifier using a serial peripheral interface.

3. The circuit of claim 1, wherein the feedback signal is received by a front-end circuit including an automatic power controller.

4. The system of claim 2, wherein the predetermined current threshold is set via the serial peripheral interface.

5. The system of claim 2, wherein the predetermined threshold voltage is set via the serial peripheral interface.

6. The system of claim 1, further comprising an antenna coupled to the power amplifier.

7. A method comprising:
    providing a first feedback signal, the first feedback signal providing a signal having a magnitude dependent upon a load voltage when the load voltage falls below a predetermined voltage threshold;
    providing a second feedback signal, the second feedback signal having a magnitude dependent upon a current when the current drawn exceeds a predetermined current threshold; and
    adding either one of the first feedback signal and second feedback signal with a power dependent contribution signal and providing the combined signal as a hybrid feedback.

8. The method of claim 7, wherein the predetermined current threshold and the predetermined voltage threshold is set via a serial peripheral interface.

9. The method of claim 8, wherein the predetermined current threshold and the predetermined voltage threshold are set using an automatic power controller.

10. A method, comprising:
    sensing a dc current;
    sensing an output voltage;
    comparing the dc current to a predetermined threshold current;
    comparing the output voltage to a predetermined minimum output voltage;
    providing a first feedback signal if the dc current exceeds the current threshold, the amplitude of the first feedback signal determined by the amount that the dc current exceeds the threshold current;
    providing a second feedback signal if the dc current is less than the current threshold and if the output voltage is less than a predetermined minimum output voltage, the magnitude of the second feedback signal determined by the amount that the predetermined minimum output voltage exceeds the output voltage;
    adding either one of the first feedback signal and second feedback signal with a power dependent contribution signal; and
    generating a hybrid feedback input signal based on the power dependent contribution and either one of the first feedback signal and the second feedback signal.

11. The method of claim 10, wherein the predetermined current threshold and the predetermined voltage threshold is set via a serial peripheral interface.

12. The method of claim 11, wherein the predetermined current threshold and the predetermined voltage threshold is set using an automatic power controller.

* * * * *